(12) United States Patent
Pandey et al.

(10) Patent No.: US 7,925,940 B2
(45) Date of Patent: Apr. 12, 2011

(54) ENHANCING SPEED OF SIMULATION OF AN IC DESIGN WHILE TESTING SCAN CIRCUITRY

(75) Inventors: Yogesh Pandey, Karnataka (IN); Vijay Anand Sankar, Karnataka (IN); Manish Jain, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 473 days.

(21) Appl. No.: 11/873,800

(22) Filed: Oct. 17, 2007

(65) Prior Publication Data

US 2009/0106612 A1 Apr. 23, 2009

(51) Int. Cl.
 *G01R 31/28* (2006.01)
 *G06F 17/50* (2006.01)
 *G06F 9/45* (2006.01)

(52) U.S. Cl. ............ 714/726; 714/727; 714/729; 716/4; 703/14; 703/22; 324/765

(58) Field of Classification Search ............... 714/726, 714/727, 729; 716/4; 324/765; 703/14, 703/22
See application file for complete search history.

(56) References Cited

U.S. PATENT DOCUMENTS

| | | | | |
|---|---|---|---|---|
| 5,854,752 A | * | 12/1998 | Agarwal | 716/7 |
| 6,046,984 A | * | 4/2000 | Grodstein et al. | 713/500 |
| 6,134,689 A | * | 10/2000 | Mateja et al. | 714/736 |
| 6,560,738 B1 | * | 5/2003 | Shigeta | 714/726 |
| 6,662,328 B1 | * | 12/2003 | Mateja et al. | 714/738 |
| 6,732,068 B2 | * | 5/2004 | Sample et al. | 703/24 |
| 6,857,094 B2 | * | 2/2005 | Shigeta | 714/736 |
| 6,895,372 B1 | | 5/2005 | Knebel et al. | |
| 7,437,698 B2 | * | 10/2008 | Deur et al. | 716/12 |
| 2005/0149805 A1 | | 7/2005 | Syed et al. | |
| 2005/0229123 A1 | | 10/2005 | Wang et al. | |

* cited by examiner

*Primary Examiner* — John J Tabone, Jr.
(74) *Attorney, Agent, or Firm* — Kanika Radhakrishnan; Evergreen Valley Law Group, P.C.

(57) ABSTRACT

A computer is programmed to prepare a computer program for simulating operation of an integrated circuit (IC) chip, in order to test scan circuitry therein. The computer is programmed to trace a path through combinational logic in a design of the IC chip, starting from an output port of a first scan cell and ending in an input port of a second scan cell. If the first and second scan cells receive a common scan enable signal, then the computer generates at least a portion of the computer program, i.e. software to perform simulation of propagating a signal through the path conditionally, for example when the common scan enable signal is inactive and alternatively to skip performing simulation when the common scan enable signal is active. The computer stores the portion of the computer program in memory, for use with other such portions of the computer program.

18 Claims, 9 Drawing Sheets

FIG. 1A (prior art)
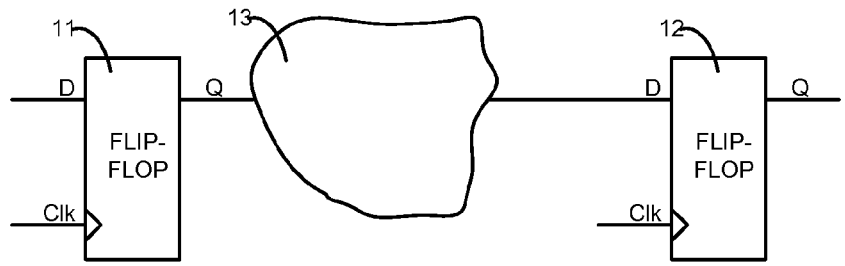
FIG. 1B (prior art)
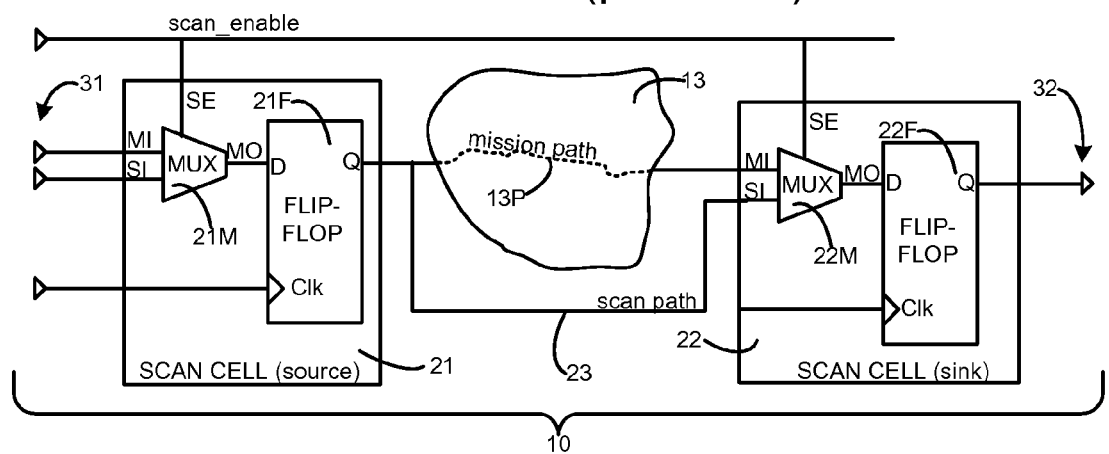
FIG. 1C
(prior art)
```
...
41 ——Q = Evaluate_Flipflop (21F);
...
42 ——propagate (Q, 13P);
...
43 ——Evaluate_Multiplexer (22M);
...
```
40

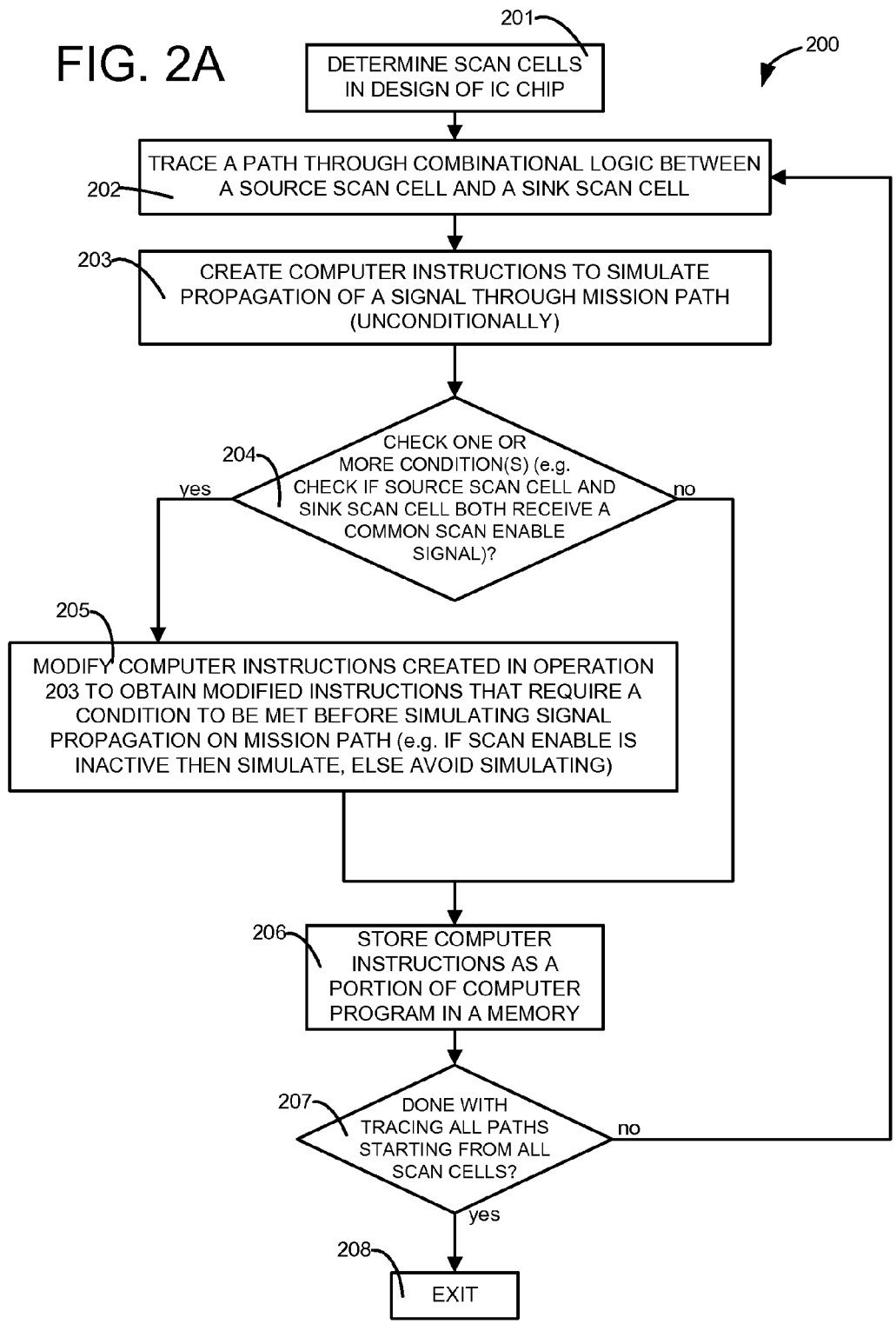

FIG. 2B

```
41
   ...
   Q = Evaluate_Flipflop (21F);
   ...

if ((!scan_enable) propagate (Q, 13P)
      else if (!(optimizable (13P)) propagate (Q, 13P);      } 250
252
      ...

43       Evaluate_Multiplexer (22M);
   ...
```

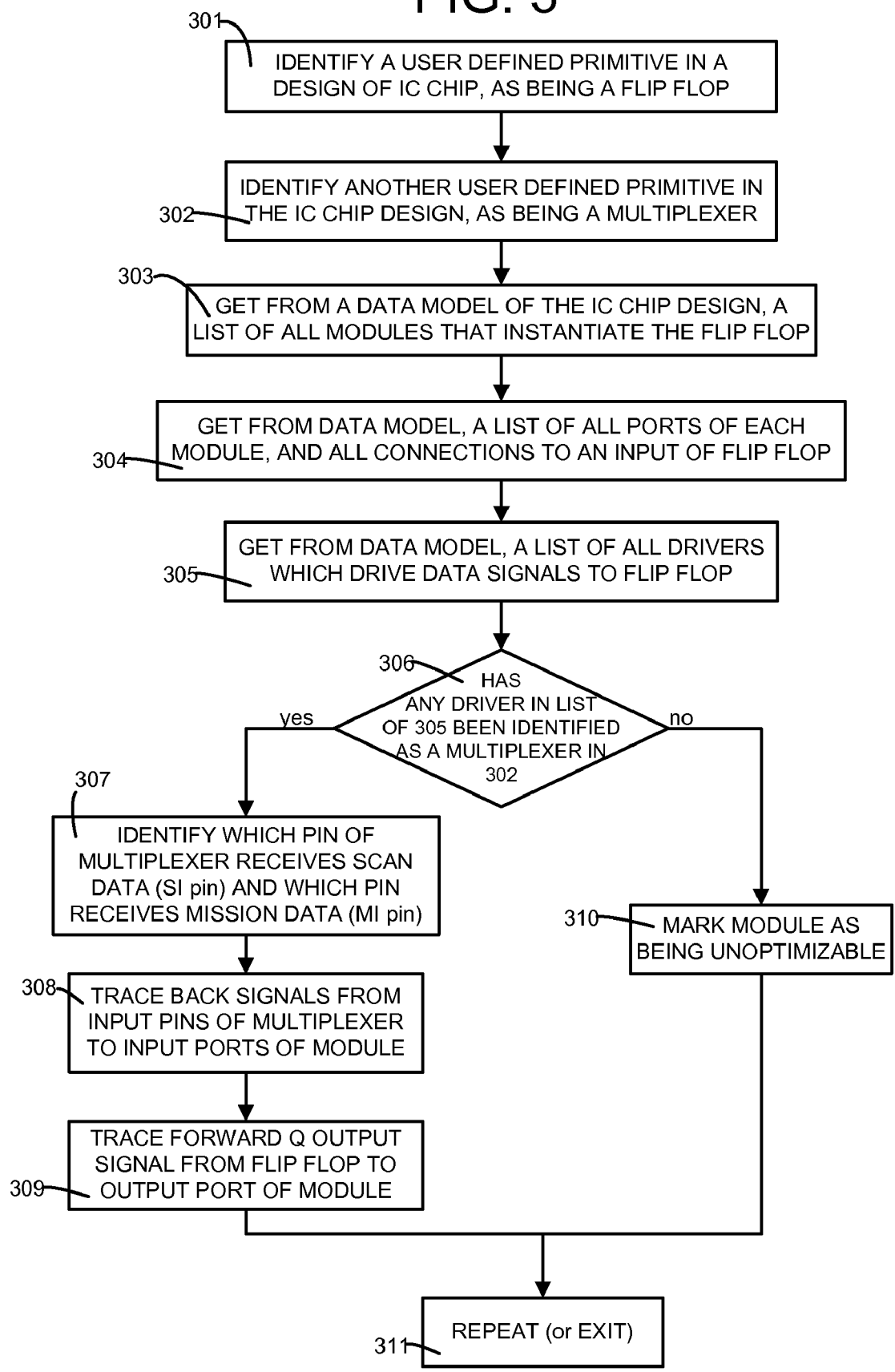

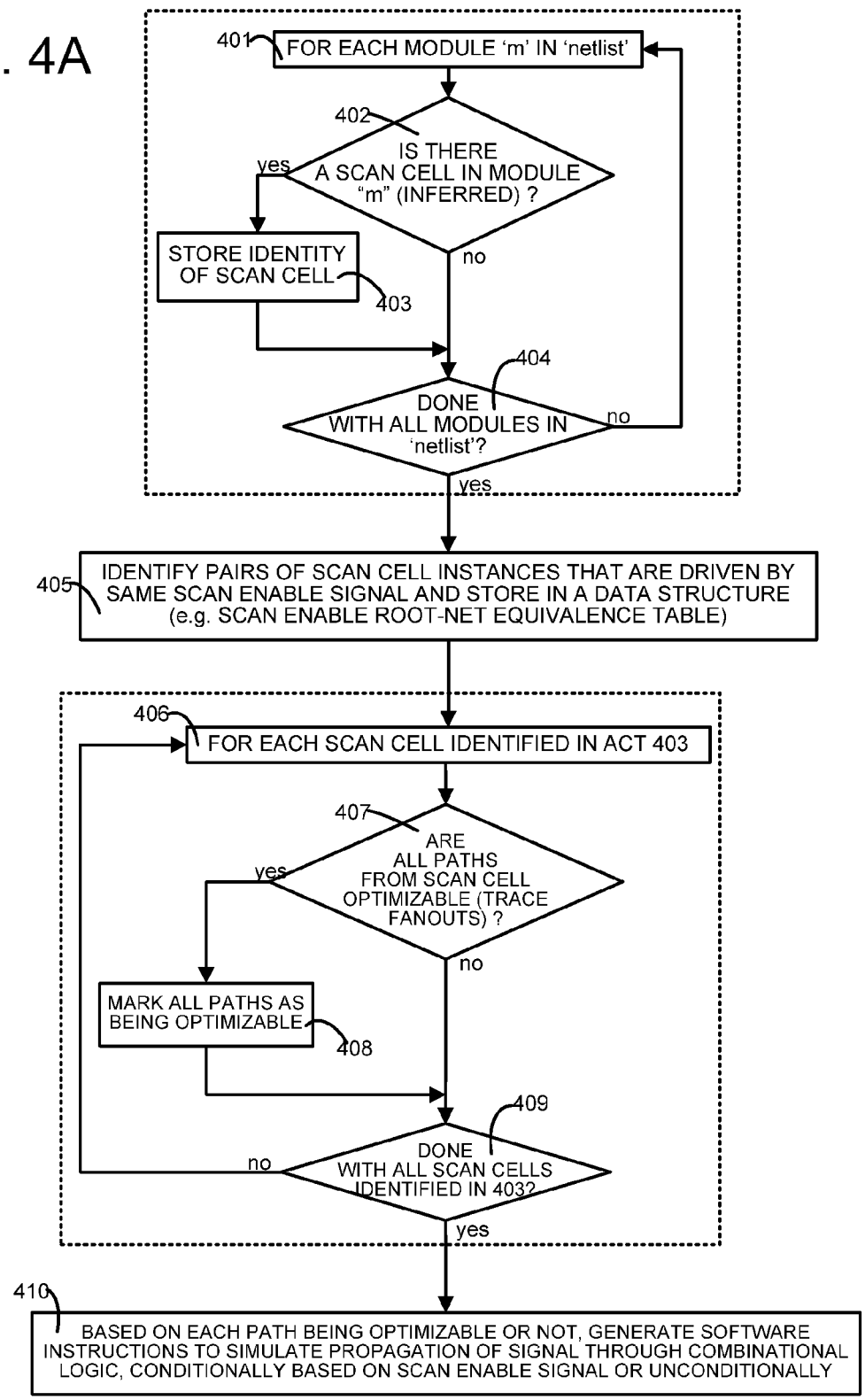

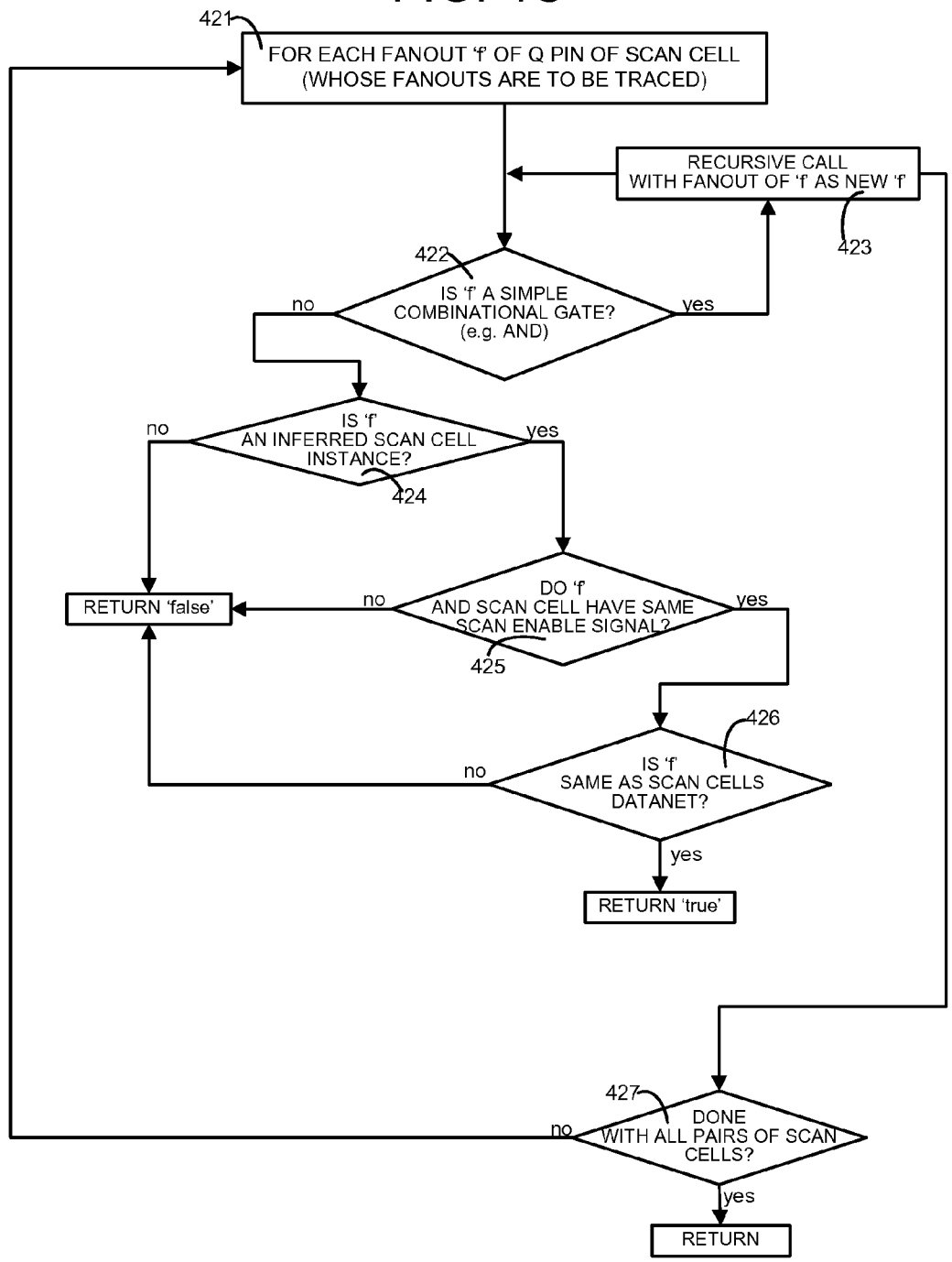

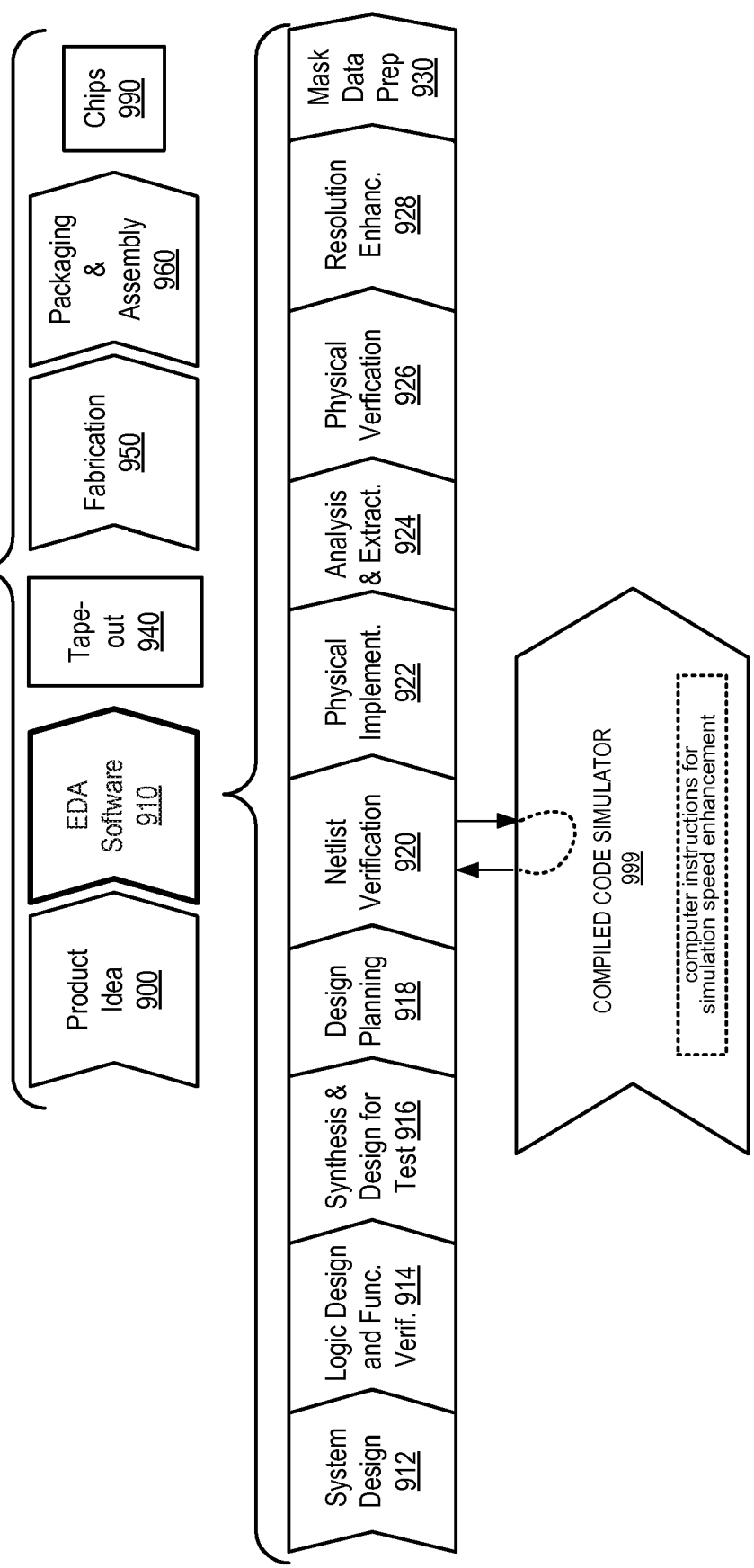

ENHANCING SPEED OF SIMULATION OF AN IC DESIGN WHILE TESTING SCAN CIRCUITRY

BACKGROUND

1. Field of the Invention

Embodiments of the invention relates to simulation of an Integrated Circuit (IC) chip for testing of test patterns that are created by Automatic Test Pattern Generation (ATPG) for use with scan circuitry within a physical IC chip.

2. Related Art

Electronic devices today contain millions of individual pieces of circuitry or "cells." To automate the design and fabrication of such devices, Electronic Design Automation (EDA) systems have been developed. An EDA system includes one or more computers programmed, for use by chip designers, to design electronic devices which may include one or more IC chips. An EDA system typically receives one or more high level behavioral descriptions of circuitry to be built into an IC chip (e.g., in Hardware Description Language (HDL) like VHDL, Verilog, etc.) and translates this behavioral description into netlists of various levels of abstraction. A netlist is typically stored in computer readable media within the EDA system and processed and verified using many well known techniques. The EDA system uses the netlist(s) to ultimately produce a physical device layout in a mask form, for use in fabricating a physical IC chip.

A Design For Test (DFT) process may take a design, for example in the form of a netlist, of an IC chip which implements a desired behavior, for example Digital Signal Processing (DSP), and replace one or more flip-flops 11-12 (FIG. 1A) with special cells called "scan cells" 21-22 (FIG. 1B) that are designed to supply test vectors from primary inputs 31 of IC chip 10 (FIG. 1B) to one or more portions 13. Portions 13 of the original IC chip's design typically include combinational logic, which couples flip-flops 11 and 12. During the just-described replacement of flip-flops with scan cells, portions 13 are typically kept unchanged. Such a modified design has two modes of operation, a mission mode which performs an intended function (e.g. DSP) for which IC chip 10 was designed, and a test mode which tests whether circuit elements in IC chip 10 have been properly fabricated.

Typically, a scan cell 21 (FIG. 1B) in such an modified design of IC chip 10 includes a flip-flop 21F that is driven by a multiplexer 21M; multiplexer 21M supplies to a data input (D input) pin of flip-flop 21F, either a signal SI if operated in test mode (during which time a scan enable signal SE is active) and alternatively supplies another signal MI if operated in the mission mode (during which time signal SE is inactive). A signal which is input to flip-flop 21F is shown in FIG. 1B as the multiplexer's output signal MO. During scan design, scan cells 21 and 22 may be identified by a chip designer as being intended to be coupled into a scan chain, which involves creation of a scan path 23 (see FIG. 1B) by coupling scan cells 21 and 22 (e.g. the input pin SI of cell 22 is coupled to the output pin Q of flip-flop 21F in cell 21). Scan path 23 is an alternative to a mission path 13P through portions 13, and a signal from one of these two paths is selected by multiplexer 22M based on its scan enable signal. Chip designer may designate either a common scan enable signal SE or designate different scan enable signals, to operate multiplexers 21M and 22M.

An additional step in developing an IC chip's design involves generating test patterns to be applied to IC chip 10. A computer programmed with ATPG software may analyze one or more representations of the IC design in the form of netlists and may automatically generate test patterns. Such test patterns (also called test vectors) are applied to scan cells in a physical IC chip by a hardware device (called "tester") to test, for example, whether certain selected portions of circuitry are fabricated correctly.

More specifically, a tester (not shown) tests IC chip 10 by loading one or more test patterns serially into one or more scan cells 21 (also called "input scan cells") from primary inputs 31 of IC chip 10 during a shifting operation (also called "loading operation"), while activating the scan enable signal. Primary inputs 31 and primary outputs 32 of IC chip 10 are external pins that are accessible from outside of chip 10, e.g. to any tester. After such a shifting operation, the tester may deactivate the scan enable signal, and operate IC chip 10 for one clock cycle with the test patterns applied to portion 13 (in a "test operation".)

The test operation is followed by one or more cycles of active scan enable signal(s) in another shifting operation (also called "unloading operation"), wherein results of test operation that were latched by output scan cells 22 are shifted to primary outputs 32 of IC chip 10. The current inventors note that during both the loading operation and the unloading operation, the selected portions 13 of circuitry between the source and sink scan cells 21 and 22 continue to operate normally in the prior art, i.e. all gates in these portions are evaluated.

Prior to fabrication of the physical IC chip, the test patterns are typically applied to a gate-level computer model of the IC chip. For example, computer instructions 40 (FIG. 1C) are obtained by converting an IC design that is expressed in a HDL into software source code (e.g. in programming language C or C++) that is either executed (after compilation) or interpreted (without compilation) in a computer. In the illustration of FIG. 1C, computer instructions 40 include three functions, a first function "Evaluate_Flipflop" simulates a signal at the output pin Q of flip-flop 21F in scan cell 21 (FIG. 1B), a second function "propagate" simulates the propagation of this signal through combinational logic 13, via mission path 13P to the MI input pin of scan cell 22. Finally, a third function "Evaluate_Multiplexer" simulates a signal that is supplied by multiplexer 22M to the input pin D of flip-flop 22F. Execution of computer instructions 40 after compilation is faster than interpreted execution, and therefore it is common to compile such software source code into compiled code.

The function "propagate" described in the previous paragraph may or may not simulate a signal's travel on scan path 23, depending on the configuration. For example, flip-flops typically have another output pin, namely the Q-pin (which is in addition to the Q pin) and in some configurations the Q-pin is used in scan chaining, in which case function "propagate" does not to do any additional simulation. In other configurations, the Q-pin is not used, and instead path divergence happens at cell instantiation. In such configurations, the Q-pin may be simulated, to drive a signal on the scan path 23.

Simulation based on compiled code is described in, for example, "Ravel-XL: A Hardware Accelerator for Assigned-Delay Compiled-Code Logic Gate Simulation" by Michael A. Riepe et al, published by University of Michigan in March 1994, and incorporated by reference herein in its entirety as background. Moreover, some compiled code simulators of the prior art are also described in U.S. Pat. No. 6,223,141 granted to Ashar on Apr. 24, 2001, which patent is also incorporated by reference herein in its entirety as background. Ashar describes speeding up levelized compiled code simulation using netlist transformations. Specifically, delay-independent cycle-based logic simulation of synchronous digital circuits with levelized compiled code simulation substantially increases speed. Sweep, eliminate, and factor reduce the number of literals. Specifically an eliminate function rids a netlist of gates whose presence increases the number of literals, i.e., collapsing these gates into their immediate fanouts reduces the number of literals. Before collapsing a gate into its fanout, the function estimates the size of the new onset. If the estimated size is greater than a preset limit, the collapse is not performed. Most of the literal count reduction is through the eliminate function.

The current inventors believe that compiled code simulators can become unduly slow. Specifically, the number of test patterns required to achieve high fault coverage increases with circuit size. Moreover, deep sub-micron technology challenges existing fault models with the possibility of more failure mechanisms and more defect types. More fault models, in turn, require more test patterns for the same fault coverage and quality level, which increases the time required to simulate the testing of the test patterns. Hence, the current inventors believe there is a need to further improve the speed of compiled code simulation.

SUMMARY

Embodiments of the invention disclosed herein provide a computer implemented method, apparatus and a computer readable medium to prepare a computer program for simulating operation of an integrated circuit (IC) chip, in order to test scan circuitry therein.

An exemplary embodiment of the invention provides a computer implemented method for to prepare a computer program for simulating operation of an IC chip, in order to test scan circuitry. The method traces a path through combinational logic in a design of the IC chip, creates a first instruction set to simulate propagating a signal through the path; modifies the first instruction set to create a second instruction set, the second instruction set requiring a predetermined condition to be met for execution of the first instruction set; and stores the first instruction set and the second instruction set in a memory.

An exemplary embodiment of the invention provides an apparatus to prepare a computer program for simulating operation of an IC chip, in order to test scan circuitry. The apparatus includes memory encoded with a design describing the IC chip; means for tracing a path through combinational logic in the design; means for checking if the first scan cell and the second scan cell receive a common scan enable signal; means for generating at least a portion of the computer program to conditionally propagate a signal through the path if the common scan enable signal is inactive and to not propagate the signal through the path if the common enable signal is active; and means for storing the portion of the computer program in the memory.

An exemplary embodiment of the invention provides a computer readable medium to prepare a computer program for simulating operation of an integrated circuit (IC) chip, in order to test scan circuitry. The computer readable medium includes instructions to trace a path through combinational logic in a design of the IC chip; instructions to create first instruction set to simulate propagating a signal through the path; instructions to modify the first instruction set to obtain a second instruction set, the second instruction set requiring a predetermined condition to be met for execution of the first instruction set; and instructions to store in a memory of a computer, as a portion of the computer program, the first instruction set and the second instruction set.

BRIEF DESCRIPTION OF THE DRAWINGS

FIGS. 1A and 1B illustrate a prior art design of an IC chip before and after insertion of scan circuitry.

FIG. 1C illustrates a portion of a prior art computer program for simulation of the design of FIG. 1B, to test the scan circuitry.

FIG. 2A illustrates, in a flow chart, a method used in accordance with an embodiment of the invention, to prepare a computer program that enhances speed of simulation.

FIG. 2B illustrates a portion of the computer program generated in accordance with an embodiment of the invention, to include a conditional statement, by performing the method of FIG. 2A.

FIG. 3 illustrates, in a flow chart, acts performed in an illustrative embodiment of the invention, to implement the method of FIG. 2A.

FIGS. 4A-4C illustrate, in flow charts, acts performed in an implementation of an embodiment of the invention.

FIG. 6 illustrates a simplified representation of an exemplary digital Application Specific IC (ASIC) design flow in accordance with an embodiment of the invention.

DETAILED DESCRIPTION

Figure 4B:
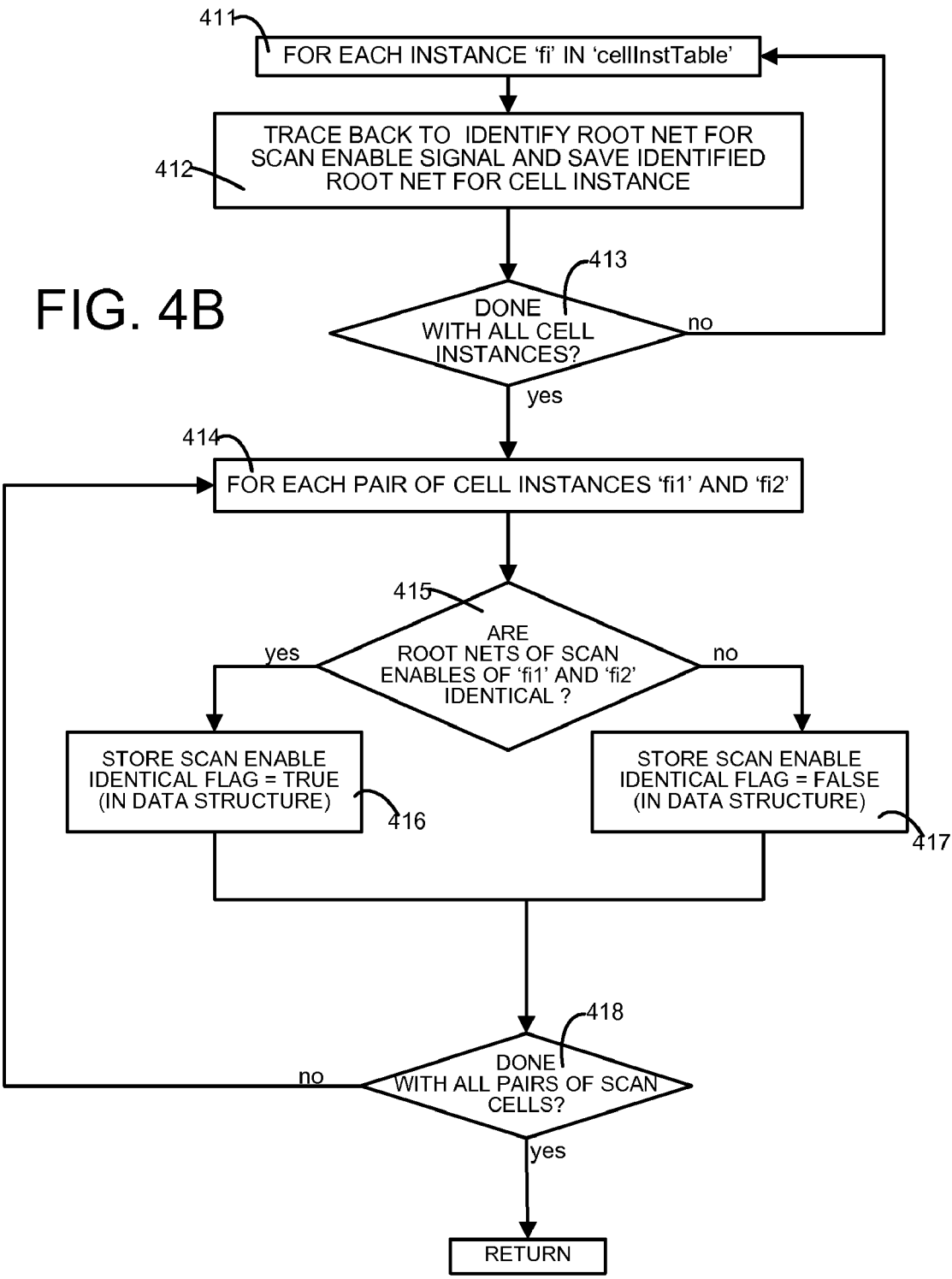

A computer 150 (FIG. 5) is programmed, in accordance with an embodiment of the invention, to perform a method 200 (FIG. 2A) to create a computer program that enhances speed of simulation of an IC chip in order to test scan circuitry. Specifically, the inventors of the current patent application note that when the scan enable signal SE (FIG. 1B) is active, a multiplexer 22M at the output of combinational logic 13 selects a signal that travels via scan path 23. Accordingly, the inventors conceived that operation of such a multiplexer (when scan enable signal is active) makes it unnecessary to simulate the propagation of a signal through portions 13, via mission path 13P. Based on this conception, the inventors formulated method 200 which enhances speed of simulation, by avoiding unnecessary simulation on path 13P when the scan enable signal is active, as discussed in the next paragraph. As will be apparent to the skilled artisan, the scan enable signal may be either an active high signal (i.e. active when the signal is high or of value "1") or alternatively an active low signal (i.e. active when the signal is low or of value "0"), depending on the embodiment.

As illustrated in FIG. 2A, in a first operation 201, computer 150 initially determines which components of the IC chip form scan cells. In this operation computer 150 also determines for each scan cell, which of its pins respectively carry (1) a scan data signal, (2) a data signal resulting from operation in the mission mode, (3) a scan enable signal, and (4) a clock signal. Computer 150 is further programmed to perform a tracing operation 202, for example to identify a path 13P through combinational logic 13. As shown in FIG. 1B, mission path 13P starts from an output pin Q of flip-flop 21F in source scan cell 21, and ends in an input pin MI of multiplexer 22M in sink scan cell 22. Computer 150 is also programmed to perform an operation 203 to create software instructions to simulate the propagation of a signal through the mission path 13P.

Note that the result of operation 203 is illustrated by prior art computer instructions 40 in FIG. 1C. Note also that computer 150 may be programmed to implement operations 201-203 in any manner apparent to the skilled artisan. Hence, specific details of the manner in which operations 201, 202 and 203 are performed by computer 150, are not critical to practicing the embodiments of the invention.

Computer 150 is further programmed to check on one or more conditions (in an operation 204) and if the condition(s) is/are met, computer 150 performs an operation 205 which is skipped if the condition(s) is/are not met. The condition(s) 997 (FIG. 5) used in operation 204 is/are predetermined, and are stored in a memory of computer 150. Certain conditions of operation 204 are used to ensure that non-simulation of path 13P will not change the results of testing one or more test patterns created by automatic test pattern generation (ATPG) for use with scan circuitry. If the conditions are satisfied, then path 13P is determined to be "optimizable," thereby making it a candidate for non-simulation.

For example, some embodiments of the invention support use of multiple scan enable signals. Accordingly, such embodiments check a predetermined condition in operation 204 as follows: whether the signal supplied to path 13P by source scan cell 21 and the signal received from path 13P by sink scan cell 22 are synchronously used (or not used), i.e. if the multiplexers 21M and 22M in the respective scan cells 21 and 22 are operated by the same scan enable signal. If the result is true, then path 13P is determined to be optimizable. Another such predetermined condition that is checked in operation 204 of some embodiments of the invention is whether path 13P contains any sequential elements, and only if the result is no then path 13P is marked by computer 150 as being "optimizable." Note that some embodiments of the invention treat a path as being optimizable if the path starts in a data pin of a scan cell and eventually ends in a data pin of a scan cell. While tracing such a path, one illustrative embodiment traces through combinational elements but not through other circuit elements. A combinational element's output state is instantly determinable from the state(s) at its input(s). The illustrative embodiment marks a path as being unoptimizable if any circuit element other than a combinational element is encountered during path tracing as described herein.

As noted above, if path 13P is found by operation 204 to be not optimizable, then computer 150 simply goes to operation 206 wherein computer instructions 40 (FIG. 1C) that were created by operation 203 are stored to memory, as one portion of a computer program, for use with other such portions (e.g. created by operation 203 by repetition). Note that the instructions 40 (i.e. software) include a statement 42 whereby the signal's propagation on path 13P is simulated unconditionally. If path 13P is found by operation 204 to be optimizable, then an optional operation 205 is performed by computer 150, as discussed next.

In operation 205, computer 150 modifies computer instructions 40 that were created in operation 203 by adding therein one or more condition(s) to be checked, to obtain modified computer instructions that avoid simulation of signal propagation along the optimizable path 13P when unnecessary. For example, as illustrated by statement 252 in modified computer instructions 250 shown in FIG. 2B, the scan enable signal is checked and if it is active then the function "propagate" is not executed, unless path 13P is not optimizable. Specifically, software statement 252 checks if path 13P is not optimizable and if not optimizable, then the function "propagate" is executed. On the other hand, regardless of whether or not path 13P is optimizable, if the scan enable signal is inactive (e.g. when mission mode is being simulated) then function propagate is again executed. Note that instructions 250 include statement 252 whereby simulation of signal propagation is performed conditionally. More specifically, statement 252 is conditioned on the state of the scan enable signal and on whether or not path 13P is optimizable.

Accordingly, as will be apparent to the skilled artisan in view of this disclosure, simulation of signal propagation through mission path 13P is eliminated, by checking one or more conditions in such modified computer instructions 250, which in turn speeds up loading and unloading operations, namely the operations to shift in or shift out test patterns from/to primary inputs/outputs. Hence, simulation of an IC design during testing of scan circuitry therein is speeded up by modified computer instructions 250 as illustrated in FIG. 2B. Therefore, after operation 205, computer 150 performs operation 206 wherein the modified computer instructions 250 are stored to memory, as a computer program portion (i.e. software) for use with other such portions. After operation 206, computer 150 goes to operation 207 and checks if all paths starting from all scan cells in the IC chip's design (e.g. in the form of a gate level netlist, see FIG. 5) have been traced. If not, then computer 150 returns to operation 202 (described above). If all paths are found in operation 207 as having been traced, then computer 150 has completed this method, and hence it exits (see operation 208).

The computer instructions resulting from operation 203 were to have been executed unconditionally (relative to the scan enable signal), as illustrated in FIG. 1C. In accordance with the invention, an operation 205 (FIG. 2A) modifies these computer instructions, to make them executable conditionally, as shown in statement 252 (FIG. 2B). While certain examples of conditions are shown in statement 252, other condition(s) may be checked in other embodiments, as will be apparent to the skilled artisan in view of this disclosure.

In some embodiments of the invention, computer 150 implements a process of the type illustrated in FIG. 3, based on operation 201 in method 200 of FIG. 2A. Specifically, in act 301, computer 150 identifies one or more User-Defined Primitives (UDPs) in a design of IC chip 10 as being for flip-flop(s). The specific UDPs which are used depend on a number of factors, such as a technology library of cells which is provided by a fabrication facility. Next, in act 302, computer 150 identifies additional UDPs in the design as being for multiplexer(s). Note that acts 301 and 302 may be implemented in any manner that will be apparent to the skilled artisan in view of this disclosure.

Thereafter, in act 303, computer 150 obtains from a data model of the IC chip design, a list of all modules that instantiate the flip-flop that was identified in act 301. Next, in act 304, computer 150 obtains from the data model, a list of all ports of each module (which when being processed individually, is referred to below as "current module") that was identified in act 303. In act 304, computer 150 also obtains all connections to an input pin of each flip-flop in the data model. Then, in act 305, computer 150 obtains from the data model, a list of all drivers which drive the data signals to each flip-flop. Then in act 306, computer 150 checks if any driver in the list obtained in act 305 has been identified as a multiplexer in act 302. If so, then computer 150 goes to act 307 to further process the multiplexer (which is referred to as the "current" multiplexer), and else goes to act 310. In act 310, computer 150 marks a path to the flip-flop's data pin D as being unoptimizable, and then proceeds to act 311.

In act 307, computer 150 identifies which pin of the current multiplexer receives scan data (i.e. identifies the SI pin), and which pin receives the mission data (i.e. identifies the MI pin). Next, in act 308, computer 150 traces back the signals from these two input pins of the current multiplexer (i.e. SI and MI pins), to the input ports of the current module. Then, in act 309, computer 150 traces forward the signal from the Q pin of the current flip-flop, to the output port of the current module. Next, computer 150 goes to act 311 wherein one or more of the above-described acts are repeated, for example, if there are paths between scan cells which have not been visited, and marked as being one of optimizable and unoptimizable. If there are no unvisited paths, then computer 150 exits this method in act 312.

Some illustrative embodiments in accordance with the invention perform the acts illustrated in FIG. 4A as discussed next. Specifically, some embodiments enter perform acts 401-404, wherein act 401 implements a "for" loop in which computer 150 individually selects each module 'm' in a 'netlist' representing the IC design. In act 402, computer 150 checks if there is a scan cell in module 'm'. If the answer is 'yes', then computer 150 goes to act 403, and stores information on the scan cell, such as its identity and the components therein, such as a multiplexer and a flip-flop. After act 403, computer 150 goes to act 404. Computer 150 also goes to act 404 if the answer in act 402 is no. Act 404 implements loop termination for act 401, by checking if all modules in the netlist have been visited in which case, computer 150 goes to operation 405 and if not it returns to act 401. Note that the specific manner in which a scan cell (and one or more of its components, such as multiplexer and flip-flop) is identified is different, depending on the embodiment, although as discussed above in reference to FIG. 3, some embodiments are based on recognition of UDPs.

In operation 405, computer 150 checks every pair of scan cell instances (e.g. identified in act 403) to see if both instances in a pair are driven by the same scan enable signal, and if so, the identity of such a pair is stored in a data structure (e.g. a two dimensional table may be used, depending on the embodiment). After operation 405, computer 150 goes to act 406, as discussed next.

Act 406 implements another "for" loop in which computer 150 individually selects each scan cell instance identified in act 403 and goes to act 407. In act 407, computer 150 checks if all paths from the current scan cell instance are optimizable, e.g. by tracing fanouts. If the answer is 'yes', then computer 150 goes to act 408 and marks all such paths as being optimizable. After act 408, computer 150 goes to act 409. Computer 150 also goes to act 409 if the answer in act 407 is no. Act 409 implements loop termination for act 406, by checking if all scan cell instances that were identified in act 403 have been visited and if so goes to operation 410 and otherwise returns to act 406.

In operation 410, computer 150 generates software instructions to simulate propagation of a signal through combinational logic which include conditions (of the type illustrated in statement 252 in FIG. 2B) or which are unconditional. As noted above, the conditions used in the software instructions are based on the scan enable signal. Moreover, whether or not the generated software instructions contain such conditions depends on the optimizability of the path. If the path is optimizable, then the software instructions are made conditional. If the path is unoptimizable, then the software instructions are unconditional.

Operation 405 of FIG. 4A may be performed in any manner that will be apparent to the skilled artisan in view of this disclosure, and the detailed implementation of operation 405 is not a critical aspect of the invention. Nonetheless, for purposes of illustration, note that some embodiments implement the acts 411-418 illustrated in FIG. 4B to implement operation 405. Specifically, in act 411, computer 150 implements a "for" loop by individually selecting each scan cell instance identified in act 403 (FIG. 4A) and goes to act 412. In act 412 computer 150 traces back to identify the root net for the scan enable signal and save the identified root net for the current cell instance. Then, computer 150 goes to act 413 wherein it checks if all cell instances have been visited and if not returns to act 411. If all cell instances have been visited, computer 150 goes to act 414, which is discussed next.

In act 414, computer 150 implements another "for" loop by individually selecting a pair of scan cell instances and goes to act 415. In act 415 computer 150 checks if the root nets of the scan enable signals of each of the scan cell instances in the currently selected pair are identical. If the answer in act 415 is 'yes', the computer 150 goes to act 416 and otherwise goes to act 417. In acts 416 and 417, computer 150 stores a flag as being true or false to respectively indicate that the scan enable signals are identical or not. After acts 416 and 417, computer 150 goes to act 418 which implements loop termination for act 414, by checking if all pairs of scan cell instances have been visited and if not goes back to act 414.

Act 407 of FIG. 4A may also be performed in any manner that will be apparent to the skilled artisan in view of this disclosure, and the detailed implementation of operation 407 is not a critical aspect of the invention. Nonetheless, for purposes of illustration, note that some embodiments implement the acts 421-427 illustrated in FIG. 4C to implement act 407. Specifically, in act 421, computer 150 implements a "for" loop by individually selecting each fanout f of a Q pin of a scan cell whose fanouts are to be traced. Next, in act 422, computer 150 checks if this fanout f is a simple combinational element which is unidirectional, such as an AND gate or an OR gate, or an inverter. If the answer is 'no' in act 422, then computer 150 goes to act 424 and checks if fanout f is an inferred scan cell instance, and if not then returns 'false', meaning the path is not optimizable. If the answer in act 424 is 'yes', then computer 150 goes to act 425 to check if fanout f and the scan cell have the same scan enable signal and if not then again returns 'false', meaning the path is not optimizable. If the answer in act 425 is 'yes', then computer 150 goes to act 426 to check if fanout f is same as scan cells dataNet and if not then again returns 'false', i.e. path is unoptimizable. If the answer in act 426 is 'yes', then computer 150 returns 'true' meaning path is optimizable.

In act 422, if the answer is 'yes', then computer 150 goes to act 423 and makes a recursive call to return to act 422, but with a new 'f' which is the fanout of the old 'f' with which act 423 had been entered. When no further fanout can be reached in act 423, e.g. if primary output is reached, then computer 150 goes to act 427 to implement loop termination for act 421, by checking if all pairs of scan cells have been visited and if not returns to act 421. If all pairs of scan cells have been visited, then computer 150 returns from this method, i.e. act 407 (FIG. 4A) is completed.

Note that any appropriately programmed computer (hereinafter "compiled code simulator") that performs method 200 to implement simulation speed enhancement as described above (e.g. in reference to FIG. 2A) may be used in a digital ASIC design flow, which is illustrated in FIG. 6 in a simplified exemplary representation. At a high level, the process of designing a chip starts with the product idea (900) and is realized in an EDA software design process (910). When the design is finalized, it can be taped-out (event 940). After tape out, fabrication process (950) and packaging and assembly processes (960) occur resulting, ultimately, in finished chips (result 990).

The EDA software design process (910) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys®, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys®, Inc. that can be used at this stage include VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys®, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys®, Inc. that can be used at this stage include Jupiter and Floorplan Compiler products.

Netlist verification (stage 920): At this step, the netlist is checked for compliance with timing constraints and for correspondence with the VHDL/Verilog source code. Exemplary EDA software products from Synopsys®, Inc. that can be used at this stage include VCS, VERA, Formality and PrimeTime products.

Figure 5:
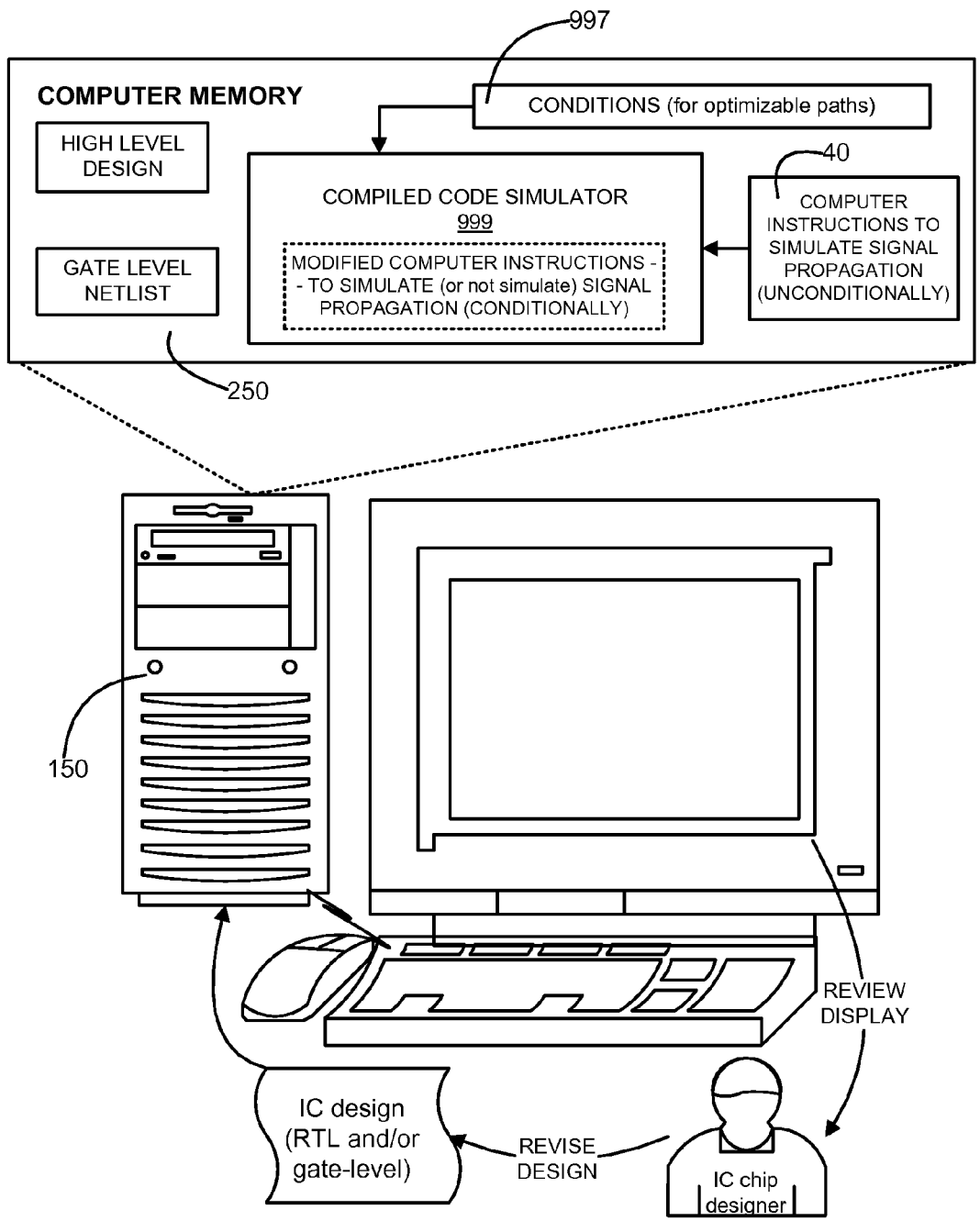
FIG. 5 illustrates, in a block diagram, a computer that is programmed in accordance with an embodiment of the invention.

Note that a compiled code simulator 999 (of the type described above that performs the method of FIG. 2A) can be used during this stage 920, as shown in FIG. 6. If the displayed results are not satisfactory, a chip designer may go back to stage 916 to make changes to the IC design as shown in FIG. 5.

Physical implementation (stage 922): The placement (positioning of circuit elements, such as the above-described sequential cells and combinational cells) and routing (connection of the same) occurs at this step. Exemplary EDA software products from Synopsys®, Inc. that can be used at this stage include the Astro product. Although circuitry and portions thereof (such as rectangles) may be thought of at this stage as if they exist in the real world, it is to be understood that at this stage only a layout exists in a computer 150. The actual circuitry in the real world is created after this stage as discussed below.

Analysis and extraction (stage 924): At this step, the circuit function is verified at a transistor level, this in turn permits what-if refinement. Exemplary EDA software products from Synopsys®, Inc. that can be used at this include Star RC/XT, Raphael, and Aurora products.

Physical verification (stage 926): At this stage various checking functions are performed to ensure correctness for: manufacturing, electrical issues, lithographic issues, and circuitry. Exemplary EDA software products from Synopsys®, Inc. that can be used at this stage include the Hercules product.

Resolution enhancement (stage 928): This involves geometric manipulations of the layout to improve manufacturability of the design. Exemplary EDA software products from Synopsys®, Inc. that can be used at this include iN-Phase, Proteus, and AFGen products.

Mask data preparation (stage 930): This provides the "tape-out" data for production of masks for lithographic use to produce finished chips. Exemplary EDA software products from Synopsys®, Inc. that can be used at this include the CATS® family of products. Actual circuitry in the real world is created after this stage, in a wafer fabrication facility (also called "fab").

The data structures and software code for implementing one or more acts described in this detailed description (e.g. FIG. 2A, 3, 4A-4C and/or subsection A below) can be encoded into a computer-readable medium, which may be any storage medium and/or any transmission medium that can hold code and/or data for use by a computer. Storage medium includes, but is not limited to, magnetic and optical storage devices such as disk drives, magnetic tape, CDs (compact discs), and DVDs (digital versatile discs). Transmission medium (with or without a carrier wave upon which the signals are modulated) includes but is not limited to a wired or wireless communications network, such as the Internet. In one embodiment, the transmission medium uses a carrier wave that includes computer instruction signals for carrying out one or more steps performed by the methods illustrated in FIG. 2A. Another embodiment uses a carrier wave that includes instructions to perform a method as illustrated in FIG. 2A.

Note that a computer system used in some embodiments to implement a simulation speed enhancer of the type described herein uses one or more linux® operating system workstations (based on IBM®-compatible PCs) and/or unix® operating systems workstations (e.g. SUN Ultrasparc, HP PA-RISC, or equivalent), each containing a 2 GHz CPU and 1 GB memory, that are interconnected via a local area network (Ethernet).

Subsection A of this detailed description section which is located below, just before the claims, is an integral portion of this detailed description and is incorporated by reference herein in its entirety. Subsection A includes pseudo-code and related information for implementing one illustrative embodiment of a simulation speed enhancer in accordance with the invention, for example, to implement the acts illustrated in FIGS. 4A-4C by use of a software product called "VCS" available from Synopsys®, Inc.

Numerous modifications and adaptations of the embodiments described herein will become apparent to the skilled artisan in view of this disclosure. Accordingly, numerous modifications and adaptations of the embodiments described herein are encompassed by the scope of the invention.

---

SUBSECTION A

```
/* Pseudo code for an illustrative implementation of the invention is
as follows */
/* top level entry*/
doScanOpt(netlist)
{
  /*
   * Infer which HDL modules match the template of a Mux-DFF scan
     cell
```

-continued

SUBSECTION A

```
 * If successfully inferred, the relevant D/SI/SE/Q nets are in
   the module.
 */
foreach modules "m" in the 'netlist'
{
    if (isScanCell(m, &DataNet, &ScanDataNet, &ScanEnableNet,
&Qnet) == true)
    {
        scanCellModuleTable.append({m, DataNet, ScanDataNet,
ScanEnableNet, Qnet});
    }
}
/* collect all instances of a scan cell in the fully expanded HDL
   description */
scanCellInstanceTable = {instances of all scan cell modules in
'scanCellModuleTable'};
/*
 * create SE-Equivalence tables to answer if a pair of scan cell instances
 * are tied to the same ScanEnable root signal.
 */
SEEquivTable = createSEEquivTable(scanCellInstanceTable, netlist);
/* Identify optimizable scan cell output (Q) signals and mark them for
special processing at code generation */
foreach instance 'fi' in 'scanCellInstanceTable'
{
    if (allPathsFromQAreOptimizable(fi, netlist))
    {
        markOutputAsOptimized(fi);
    }
}
}
/* routine to create SE root-net equivalence table */
Table createSEEquivTable(cellInstTable, netlist)
{
    foreach instance 'fi' in 'cellInstTable'
    {
        fi.rootSENet = traceBackAndFindRootNet(fi.ScanEnableNet);
    }
    foreach pair <fi1, fi2>
    {
        if (fi1.rootSENet != fi2.rootSENet)
            SEEquivTable[<fi1, fi2>] = false;
        else
            SEEquivTable[<fi1, fi2>] = true;
    }
    return SEEquivTable;
}
/* routine to check if this instance can have its output optimally
propagated */
ScanCellInstance currentSourceInst;
bool traceFanouts(signal, netlist)
{
    foreach fanout 'f' of signal
    {
        if ('f' is a simple combinational gate) {
            return traceFanouts(f->fanOut); /* recursively call for fanouts */
        } else if ('f' is an inferred scanCellInstance) {
            if (SQEquivTable[<currentSourceInst, f>] == false)
                return false;
            else if (signal == f.DataNet)
                return true;
            else
                return false;
        } else {
            return false;
        }
    }
}
bool allPathsFromQAreOptimizable(SourceScanCellInstance, netlist)
{
    currentSourceInst = SourceScanCellInstance;
    /* trace forward fanouts of scanCellInstance.Q */
    if (traceFanouts(Q,netlist) == true) {
        return true;
    } else {
        return false;
    }
}
/* Routine for scan cell template matching */
bool isScanCell(m, pD, pSI, pSE, pQ)
{
    if (m->hasOneSequentialUDP( ) == false)
        return false;
    pQ = udp.Q;
    /* trace back data pport of the UDP through simple gates (if any) */
    if ((muxFound = traceBackTillMux(udp.D)) == false)
        return false;
    else {
        D = mux.A; SI = mux.B; SE = mux.C;
    }
    /* trace back D/SI/SE signals till the module port boundary. Return false
       if any loops, complex gates are found in the path */
    if ((traceBackTillPort(D, pD, SI, pSI, SE, dSE) == false)
        return false;
    /* success with template match. return true; */
    return true;
}
/* changes to code generation routine */
doCodeGen(netlist)
{
    ......
    /*
     * while generating propagation routine of cellInstance.Q, check if it
     * was marked to be optimized by doScanOpt( ). If yes, then generate
guarded code.
     */
    if (isMarkedAsOptimized(cellInstance.Q))
    {
        codeGenIfCheck("if (cellInstance.SE == 0) ");
    }
    codeGenPropagate("propagate(Q);");
    ......
}
```

What is claimed is:

1. A method of preparing a computer program for simulating operation of an integrated circuit (IC) chip to test scan cells included in said IC chip, said method comprising:
    tracing a path through combinational logic in a design of the IC chip, said path starting from an output port of a first scan cell in said design and the path ending in an input port of a second scan cell in the design;
    creating a first instruction set to simulate propagating a signal through said path;
    if said path is optimizable, modifying said first instruction set to create a second instruction set, said second instruction set requiring a predetermined condition to be met for execution of the first instruction set to avoid unnecessary simulation of signal propagation; and
    storing, in a memory, the first instruction set and the second instruction set.

2. The method of claim 1 wherein:
    modifying said first instruction set comprises modifying said first instruction set if a common scan enable signal is supplied to each of said first scan cell and said second scan cell; and
    storing the first instruction set and the second instruction set comprises storing the first instruction set and the second instruction set if each of first scan call and second scan cell receive different enable signals.

3. The method of claim 1 wherein: storing the first instruction set and the second instruction set comprises storing the second instruction set if a common scan enable signal is supplied to each of said first scan cell and said second scan cell.

4. The method of claim 3 wherein: said predetermined condition comprises said common scan enable signal being inactive.

5. The method of claim 1 further comprising, prior to said tracing: determining, from said design, a plurality of scan cells comprising at least said first scan cell and said second scan cell.

6. The method of claim 5 wherein said determining comprises: identifying for each scan cell in said plurality, a flip-flop and a multiplexer preceding said flip-flop.

7. The method of claim 6 wherein said determining further comprises:
identifying, based on said design, at least one module that instantiates the flip-flop and the multiplexer.

8. The method of claim 7 wherein said determining comprises: identifying a user-defined primitive used by said module to represent said multiplexer.

9. An apparatus for preparing a computer program that simulates operation of an integrated circuit (IC) chip to test scan cells included in the IC chip, the apparatus comprising:
a computer including a memory that can receive an IC design;
a compiled code simulator in the memory, the compiled code simulator responsive to an IC design to:
trace a path through combinational logic in said design, said path starting from an output port of a first scan cell in the design and the path ending in an input port of a second scan cell in the design;
check if said first scan cell and said second scan cell receive a common scan enable signal;
if the path is optimizable, generate instructions to conditionally propagate a signal through the path if said common scan enable signal is inactive and to not propagate said signal through the path if the common enable signal is active to avoid unnecessary simulation of signal propagation; and
store the generated instructions in the memory.

10. The apparatus of claim 9 wherein the compiler code simulator is responsive to an IC design to determine, from the design, a plurality of scan cells comprising at least the first scan cell and the second scan cell.

11. The apparatus of claim 10 wherein the compiler code simulator identifies, for each scan cell in said plurality, a flip-flop and a multiplexer preceding said flip-flop.

12. The apparatus of claim 10 wherein the compiler code simulator identifies, based on the design, at least one module that instantiates the flip-flop and the multiplexer.

13. The apparatus of claim 12 wherein the compiler code simulator identifies a user-defined primitive used by said at least one module to represent the multiplexer.

14. A non-transitory computer-readable medium encoded with instructions for preparing a computer program for simulating operation of an integrated circuit (IC) chip to test scan cells included on the IC chip, the medium comprising:
instructions to trace a path through combinational logic in a design of the IC chip, said path starting from an output port of a first scan cell in said design and the path ending in an input port of a second scan cell in the design;
instructions to create first instruction set to simulate propagating a signal through said path;
instructions to modify said first instruction set if the path is optimizable to obtain a second instruction set, said second instruction set requiring a predetermined condition to be met for execution of the first instruction set to avoid unnecessary simulation of signal propagation; and
instructions to store in a memory of a computer, the first instruction set and the second instruction set.

15. The medium of claim 14 further comprising: instructions to determine, from the design, a plurality of scan cells comprising at least the first scan cell and the second scan cell.

16. The medium of claim 14 further comprising: instructions to identify for each scan cell in said plurality of scan cells, a flip-flop and a multiplexer preceding said flip-flop.

17. The medium of claim 14 further comprising: instructions to identify, based on said design, at least one module that instantiates a flip-flop and a multiplexer preceding the flip-flop.

18. The medium of claim 14 further comprising: instructions to identify a user-defined primitive used by at least one module in said design to represent a multiplexer.

* * * * *